SUPERHETERODYNE MIXER WITH NEGATIVE FEEDBACK FOR STABILIZING CONVERSION GAIN

Filed Jan. 30, 1952

INVENTOR

Gail E. Boggs

BY Howard L. Rose

AGENT

United States Patent Office 2,753,449

Patented July 3, 1956

2,753,449

SUPERHETERODYNE MIXER WITH NEGATIVE FEEDBACK FOR STABILIZING CONVERSION GAIN

Gail E. Boggs, Falls Church, Va., assignor to the United States of America as represented by the Secretary of Commerce Application January 30, 1952, Serial No. 269,104

1 Claim. (Cl. 250—20)

(Granted under Title 35, U. S. Code (1952), sec. 266)

The invention described herein may be manufactured and used by or for the Government of the United States for governmental purposes without the payment to me of any royalty thereon in accordance with the provisions of the act of March 3, 1883, as amended (45 Stat. 467; 35 U. S. C. 45).

This invention relates to the improvement of gain stability of a superheterodyne mixer and particularly to the use of negative feedback in the mixer stage of a superheterodyne receiver to make the gain of the mixer independent of the parameters in the mixer stage.

In the making of radio field-intensity measurements where continuous records are to be made over long periods of time, it is desirable to provide receiving equipment with long-time calibration stability. In most laboratories, personnel is available to make continuous adjustments of the measuring apparatus and long-time stability is not essential. However, in radio field measurements the apparatus is often located at remote points where personnel is not readily available for making these adjustments. It therefore becomes necessary to have equipment which is inherently stable over long periods. To date, one of the major problems confronting researchers in this field has been the need for radio receivers with a gain-stabilized mixer stage; that is, a mixer stage whose gain is independent of the conversion transconductance of the mixer tube and of changes in the operating voltages, the oscillator injection voltage, the plate load impedance, and the passive elements. This problem has been recognized for some time and an attempt to overcome this difficulty was made by D. G. Tucker. The Tucker circuit is reasonably successful, but it has certain inherent difficulties. Tucker obtains a point of absolute stability by differentiation. The stability of the stage is very good as long as the change in conversion transconductance remains incremental; that is, rather small. When these changes become large the basic premise no longer holds and stability suffers. Also the Tucker system is relatively complex and requires a tube in the feedback circuit. If this tube and the mixer tube do not age similarly the gain stability is severely affected.

It is therefore the primary object of this invention to gain stabilize the mixer stage of a superheterodyne receiver by providing a simple and reliable feedback circuit.

It is another object of this invention to make the gain of the mixer stage of a superheterodyne receiver independent of the parameters of the mixer stage.

It is a further object of this invention to gain stabilize the mixer stage of a superheterodyne receiver by feeding back a portion of the intermediate-frequency voltage to the signal grid of the mixer tube.

It is another object of this invention to improve the linearity of the mixer stage by negative feedback in the mixer stage.

It is another object of this invention to improve the longtime calibration stability of a superheterodyne receiver by making the gain of the mixer stage independent of the conversion transconductance of the mixer tube and of changes in the operating voltages, the oscillator injection voltage, the plate load impedance and the passive elements of the mixer stage.

In accordance with the present invention a portion of the difference frequency is fed back to the signal input grid of the mixer stage. It will be shown that when this is done the gain of the mixer stage becomes independent of the voltages and passive elements of the stage except for possible changes in the capacitive voltage dividers used to obtain the feedback voltage. Also theoretically, the gain becomes independent of both the amplifier and conversion transconductance of the mixer tube. Practically, however, two factors remain in the gain equation which vary slightly, one related to the amplifier transconductance and the other related to the conversion transconductance of the tube. It will be shown, however, that these constants are so related in the equation for gain that the variations in the one counteract the variations in the other. This latter provision takes advantage of characteristics that are common to most mixer tubes.

Other uses and advantages of the invention will become apparent upon reference to the specification and drawings.

Figure 1:
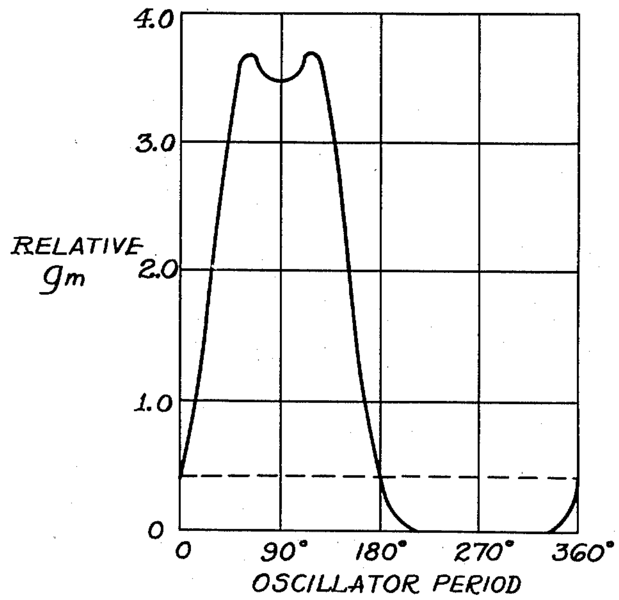
Figure 1 is a graph of the switching function of the mixer tube.

Figure 1 is a graph showing the variations in the amplifier transconductance of a mixer tube with respect to the oscillator period. In general it is desirable to use a large voltage of oscillator frequency in order to minimize changes in the conversion transconductance with variations in applied voltage at signal frequency. As a result of the large oscillator voltage being applied to the mixer tube, the mixer transconductance is driven from maximum on one half cycle to zero on the other. This is clearly shown by the curve in Figure 1.

It is possible to express the instantaneous value of the transconductance by means of a Fourier series.

$$g_m = b_0 + a_1 \sin \omega_2 t + a_2 \sin 2\omega_2 t + \ldots + b_1 \cos \omega_2 t + b_2 \cos 2\omega_2 t + \ldots \quad (1)$$

where $\omega_2$ is the angular frequency of the oscillator voltage.

For the type of switching or modulating function generally encountered, it is necessary to determine the coefficients of the different terms in the Fourier series experimentally by graphical integration of the characteristic of the tube under consideration. In this case the transconductance may be represented by the series $$g_m = b_0 + a_1 \sin \omega_2 t + a_3 \sin 3\omega_2 t + a_5 \sin \omega_5 t + \ldots + b_2 \cos 2\omega_2 t + b_4 \cos 4\omega_2 t + b_6 \cos 6\omega_2 t + \ldots \quad (2)$$

The terms including constants $a_5$ and $b_6$ are neglected, since with graphical integration they contribute very little to the result.

Figure 2:
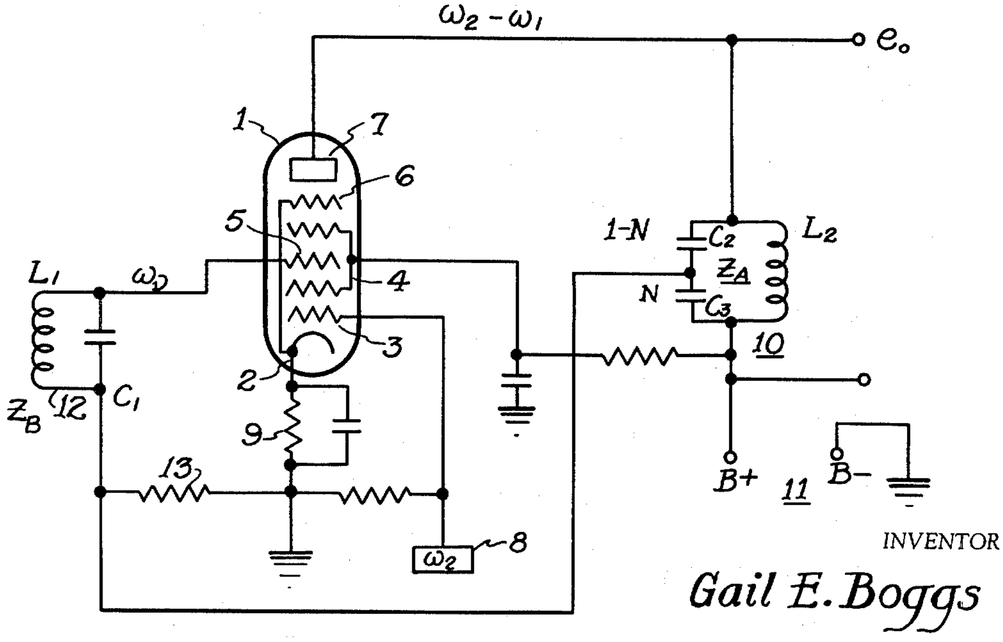
Figure 2 is a circuit diagram of the mixer stage with feedback.

When applying Equation 2 to a simple feedback mixer reference is made to the circuit of Figure 2.

Figure 2 shows a mixer tube 1 with a cathode 2, grids 3, 4, 5, and 6, and plate 7. The plate 7 is connected through the tank circuit 10, composed of the coil $L_2$ and the condensers $C_2$ and $C_3$, and the B supply 11 to ground. The cathode 2 is connected to a bypassed resistor 9 to furnish the correct bias, and the grid 3 is connected to the output of some source of electrical oscillations 8. The input signal $\omega_1$ is fed to the grid 5 of the mixer tube through the tank circuit 12. The tank circuit is grounded through the grid resistor 13. The feedback is taken from the junction of the condensers $C_2$ and $C_3$ and applied to the signal grid 5 through the tank circuit 12.

This feedback is of a different frequency than either $\omega_1$ or $\omega_2$. Ordinarily it will be the desired intermediate frequency of the mixer output, but obviously any of the possible frequencies resulting from the mixing process could be utilized. The term "transform frequency" is used in the present specification and claims to denote any one of the frequencies resulting from the mixing of $\omega_1$ and $\omega_2$ that applicant may desire to utilize as the output of the mixer.

In applying Equation 2 to the analysis of the feedback mixer, let the input signal voltage at angular frequency $\omega_1$ be $$e_s=E_s \sin \omega_1 t \qquad (3)$$

Since the output circuit 10 is tuned to the difference frequency $(\omega_2-\omega_1)$ only this component need be considered in the output voltage $e_0$, thus $$e_0=E_0 \cos (\omega_2-\omega_1)t \qquad (4)$$

The input parallel resonant circuit 12 is tuned to the angular frequency of the incoming signal $\omega_1$, and therefore it offers practically no impedance to the difference frequency. The feedback voltage is $Ne_0$, where N is the stepdown ratio of the output circuit. The grid-to-cathode voltage $e_g$ is therefore $$e_g=E_s \sin \omega_1 t+NE_0 \cos (\omega_2-\omega_1)t \qquad (5)$$

The output voltage of the mixer is $$e_0=i_pZ_A \qquad (6)$$

where $Z_A$ is the output load impedance.

However, in pentodes $r_p>>Z_A$, and therefore $i_p \simeq g_m e_g$. Then $$e_0=g_m e_g Z_A \qquad (7)$$

Substituting the expressions of Equations 2 and 5 in Equation 7, and expanding, the result is $$e_0=[b_0E_s \sin \omega_1 t+b_0NE_0 \cos (\omega_2-\omega_1)t+a_1E_s \sin \omega_2 t \sin \omega_1 t+a_1NE_0 \sin \omega_2 t \cos (\omega_2-\omega_1)t+ \ldots]Z_A \qquad (8)$$

Since only the difference frequency $(\omega_2-\omega_1)$ is of importance and remembering that $$\sin \omega_2 t \sin \omega_1 t=\tfrac{1}{2}[\cos (\omega_2-\omega_1)t-\cos (\omega_2+\omega_1)t]$$

Equation 8 becomes $$e_0=Z_A\left[b_0NE_0 \cos (\omega_2-\omega_1)t+\frac{a_1E_s}{2} \cos (\omega_2-\omega_1)t\right] \qquad (9)$$

Collecting terms with the aid of Equation 4

$$E_0=\frac{a_1E_sZ_A}{2(1-b_0NZ_A)} \qquad (10)$$

By definition, the gain with feedback is $$A_f=E_0/E_s$$

Therefore $$A_f=\frac{a_1Z_A}{2(1-b_0NZ_A)} \qquad (11)$$

Now let $$b_0=K_0\frac{\check{g}_m}{\pi}$$

and $$a_1=K_1\frac{\hat{g}_m}{\pi}$$

where $\check{g}_m$ is the maximum transconductance. Equation 11 now becomes $$A_f=\frac{K_1\hat{g}_mZ_A}{2(\pi-K_0N\hat{g}_mZ_A)} \qquad (12)$$

In Equation 12, when $K_0Ng_mZ_A>>-\pi$, the gain to a good approximation is $$A_f=\frac{K_1\hat{g}_mZ_A}{2K_0N\hat{g}_mZ_A}=\frac{K_1}{2K_0N} \qquad (13)$$

The above analysis applies equally well to triodes, tetrodes, and the other multigrid tubes so long as the plate resistance is large compared with the plate load impedance.

Thus it can be seen that the gain of the mixer stage is, to a large extent, independent of the applied voltages and the oscillator injection voltage, which, of course, presents no problem other than that it must be large. All passive circuit elements have been eliminated from the equation except the condensers $C_2$ and $C_3$ which, since they are a part of the feedback voltage divider circuit, cannot be dispensed with. Theoretically, the values $K_1$ and $K_0$ are absolute constants, but in practice this is not true and these values do vary. The value $K_0$ is related to the amplifier transconductance and the value $K_1$ is related to the conversion transconductance. However, the present invention has also made it possible to substantially eliminate the effects of the variations in these values. Over the greatest portion of the life of most mixer tubes the amplifier and conversion transconductances vary in the same proportion, and since $K_0$ and $K_1$ are related to their respective transconductances in the same way, the effects of these variations are cancelled out, as can be seen by reference to equation 13.

The negative feedback also improves the linearity of the stage as long as the feedback is large, as it is in this case.

It will be apparent that the embodiments shown are only exemplary and that various modifications can be made in construction and arrangement within the scope of my invention as defined in the appended claims.

I claim:

A gain stabilized mixer comprising a mixer tube with an anode, a first grid and a second grid, an input impedance one end of which is connected to one of said grids, said other grid connected to a source of voltage oscillations, said anode connected through a parallel resonant tank circuit to a direct-current voltage source, said tank circuit comprising a coil and two condensers tuned to one of the transform frequencies developed in the mixer and a direct electrical negative feedback connection from a point between said condensers to the other end of said input impedance for applying a portion of the voltage across said tank circuit in such a sense as to oppose the output from said mixer tube.

References Cited in the file of this patent

UNITED STATES PATENTS

| | | |
|---|---|---|
| 2,062,004 | Hansell | Nov. 24, 1936 |
| 2,093,565 | Koch | Sept. 21, 1937 |
| 2,107,395 | Schlesinger | Feb. 8, 1938 |
| 2,111,765 | Franks | Mar. 22, 1938 |
| 2,248,785 | Roberts | July 8, 1941 |
| 2,503,780 | Van Der Ziel et al. | Apr. 11, 1950 |
| 2,582,725 | Strutt et al. | Jan. 15, 1952 |